United States Patent
Suzuki et al.

(10) Patent No.: US 10,939,597 B2
(45) Date of Patent: Mar. 2, 2021

(54) COMPONENT MOUNTING DEVICE

(71) Applicant: YAMAHA HATSUDOKI KABUSHIKI KAISHA, Iwata (JP)

(72) Inventors: Naoki Suzuki, Iwata (JP); Norimitsu Suzuki, Iwata (JP)

(73) Assignee: YAMAHA HATSUDOKI KABUSHIKI KAISHA, Iwata (JP)

( * ) Notice: Subject to any disclaimer, the term of this patent is extended or adjusted under 35 U.S.C. 154(b) by 119 days.

(21) Appl. No.: 16/475,981

(22) PCT Filed: Jan. 13, 2017

(86) PCT No.: PCT/JP2017/001037
§ 371 (c)(1),
(2) Date: Jul. 3, 2019

(87) PCT Pub. No.: WO2018/131139
PCT Pub. Date: Jul. 19, 2018

(65) Prior Publication Data
US 2019/0357394 A1 Nov. 21, 2019

(51) Int. Cl.
*B23P 19/00* (2006.01)
*H05K 13/00* (2006.01)
*H05K 13/04* (2006.01)

(52) U.S. Cl.
CPC ..... *H05K 13/0061* (2013.01); *H05K 13/0409* (2018.08); *H05K 13/0411* (2018.08); *H05K 13/0413* (2013.01); *Y10T 29/53174* (2015.01)

(58) Field of Classification Search
CPC .......... H05K 13/0061; H05K 13/0409; H05K 13/0411; H05K 13/0413; H05K 3/0097; Y10T 29/53174; Y10T 29/53191

USPC .................................................... 29/739, 743
See application file for complete search history.

(56) References Cited

U.S. PATENT DOCUMENTS

| 5,093,984 | A | * | 3/1992 | Lape | ................... | H05K 13/0061 29/741 |
| 5,783,870 | A | * | 7/1998 | Mostafazadeh | ....... | H01L 25/105 257/791 |
| 6,094,061 | A | * | 7/2000 | Saouli | ................ | G01R 31/2806 324/750.16 |

(Continued)

FOREIGN PATENT DOCUMENTS

| CN | 1372785 A | 10/2002 |
| CN | 103391707 A | 11/2013 |
| CN | 103416116 A | 11/2013 |

(Continued)

OTHER PUBLICATIONS

International Search Report issued in PCT/JP2017/001037; dated Apr. 11, 2017.

(Continued)

*Primary Examiner* — Donghai D Nguyen
(74) *Attorney, Agent, or Firm* — Studebaker & Brackett PC

(57) ABSTRACT

A component mounting device includes a conveyance unit that conveys a placement member on which a mounting target is placed, a head unit movable in a horizontal plane, and a controller. The controller transfers the mounting target from the conveyance unit to a transfer position by controlling movement of the head unit in the horizontal plane in a state in which the placement member is held by one or a plurality of heads of the head unit.

20 Claims, 7 Drawing Sheets

(56) References Cited

U.S. PATENT DOCUMENTS 7,082,680 B2 * 8/2006 Kim ................. H05K 3/0097
29/739

FOREIGN PATENT DOCUMENTS

| | | | |
|---|---|---|---|
| CN | 103781341 | A | 5/2014 |
| CN | 106031313 | A | 10/2016 |
| CN | 106132184 | A | 11/2016 |
| JP | 2005-210003 | A | 8/2005 |
| JP | 2013-074240 | A | 4/2013 |
| JP | 2013-084717 | A | 5/2013 |
| JP | 2013-138077 | A | 7/2013 |
| JP | 5411689 | B2 | 2/2014 |
| JP | 2014-220406 | A | 11/2014 |
| JP | 5721469 | B2 | 5/2015 |
| JP | 2016-152393 | A | 8/2016 |
| JP | 6008419 | B2 | 10/2016 |

OTHER PUBLICATIONS

Written Opinion issued in PCT/JP2017/001037; dated Apr. 11, 2017.
An Office Action mailed by the China National Intellectual Property Administration dated Jun. 30, 2020, which corresponds to Chinese Patent Application No. 201780082806.1 and is related to U.S. Appl. No. 16/475,981 with English language translation.

* cited by examiner

FIG.8

| W1 (WIDTH OF MOUNTING TARGET) | W2 (WIDTH OF PLACEMENT MEMBER) | D1 (DISTANCE BETWEEN HEADS) | HEADS TO BE USED |
|---|---|---|---|
| W1<d | W2>d | D1=d | |
| d<W1<2d | W2>2d | D1=2d | |
| 2d<W1<3d | W2>3d | D1=3d | |

FIG.9

| W1 (WIDTH OF MOUNTING TARGET) | D1 (DISTANCE BETWEEN HEADS) | WIDTH W2 OF PLACEMENT MEMBER TO BE USED |
|---|---|---|
| W1<d | D1=d | W2>d |
| d<W1<2d | D1=2d | W2>2d |
| 2d<W1<3d | D1=3d | W2>3d |

COMPONENT MOUNTING DEVICE

CROSS-REFERENCE TO RELATED APPLICATION

This application is a National Stage of International Patent Application No. PCT/JP2017/001037, filed Jan. 13, 2017, the entire content of which is incorporated herein by reference.

BACKGROUND

Technical Field

The present disclosure relates to a component mounting device, and more particularly, it relates to a component mounting device that transfers a mounting target from a conveyance unit to a transfer position.

Background Art

Conventionally, a component mounting device that transfers a mounting target from a conveyance unit to a transfer position is known. Such a component mounting device is disclosed in Japanese Patent No. 5721469.

Japanese Patent No. 5721469 discloses a component mounting device that transfers a substrate (mounting target) from a substrate conveyance device (conveyance unit) to a substrate holder (transfer position) located at a different position from that of the substrate conveyance device, and mounts components on the substrate held by the substrate holder. In this component mounting device, a dedicated substrate transfer device is provided to transfer the substrate from the substrate conveyance device to the substrate holder.

SUMMARY

However, in the aforementioned component mounting device described in Japanese Patent No. 5721469, the dedicated substrate transfer device is provided to transfer the substrate from the substrate conveyance device to the substrate holder, and thus there is a problem that the device structure becomes complex.

The present disclosure thus provides a component mounting device capable of transferring a mounting target while significantly reducing or preventing the complexity of the device structure.

A component mounting device according to an aspect of the present disclosure includes a conveyance unit that conveys a placement member on which a mounting target is placed, a head unit including a head that holds a component and mounts the held component on the mounting target, the head unit movable in a horizontal plane, and a controller that controls operation of the head unit. The controller controls transfer of the mounting target from the conveyance unit to a transfer position located at a position different from that of the conveyance unit by controlling at least movement of the head unit in the horizontal plane in a state in which the placement member is held by one or a plurality of heads of the head unit.

In the component mounting device according to this aspect of the present disclosure, as described above, the controller controls the transfer of the mounting target from the conveyance unit to the transfer position located at the position different from that of the conveyance unit by controlling at least the movement of the head unit in the horizontal plane in the state in which the placement member is held by the one or the plurality of heads of the head unit. Accordingly, the mounting target (placement member) can be transferred from the conveyance unit to the transfer position by the head unit that mounts the component, and thus it is not necessary to separately provide a dedicated device for transferring the mounting target. Consequently, the mounting target can be transferred while the complexity of the device structure is significantly reduced or prevented. Furthermore, when the mounting target is transferred, the head unit holds not the mounting target itself but the placement member on which the mounting target is placed such that as compared with the case in which the mounting target is directly held by the head unit, the degree of freedom in selecting a holding position of the head unit can be improved.

In the aforementioned component mounting device according to this aspect, the controller preferably controls lowering of the plurality of heads toward the placement member, and synchronous raising of the plurality of heads that hold the placement member after controlling the plurality of heads to hold the placement member. According to this structure, the placement member can be raised by the plurality of heads while a good holding state is maintained. Consequently, when the placement member is raised by the plurality of heads, positional deviation and fall of the placement member can be significantly reduced or prevented.

In the aforementioned component mounting device according to this aspect, the controller preferably controls one or more pairs of the heads to hold the placement member in such a manner as to sandwich the mounting target when the plurality of heads hold the placement member. According to this structure, the placement member can be held by the one or more pairs of the heads at symmetrical positions across the mounting target, and thus the placement member can be held in a balanced manner Consequently, when the placement member is transferred, positional deviation and fall of the placement member can be significantly reduced or prevented.

The aforementioned component mounting device according to this aspect preferably further includes a suction nozzle attached to a tip of the head, and the suction nozzle attached to the one or the plurality of heads preferably suctions the placement member such that the head unit holds the placement member. According to this structure, the placement member can be held only by suctioning the placement member, and thus the head of the head unit can easily hold the placement member. Furthermore, the placement member is held by the suction nozzle that holds the component such that the suction nozzle can be shared, and thus an increase in the number of components due to transfer of the placement member can be significantly reduced or prevented. Moreover, the degree of freedom in selecting the holding position (suction position) of the head unit can be improved.

The aforementioned component mounting device according to this aspect preferably further includes a gripper attached to a tip of the head, and the gripper attached to the one or the plurality of heads preferably grasps a pair of facing portions of the placement member such that the head unit holds the placement member. According to this structure, the placement member can be held more stably as compared with the case in which the placement member is held by suction, and thus when the placement member is held and transferred, positional deviation and fall of the placement member can be further significantly reduced or prevented.

In this case, the placement member preferably includes a pair of notches or openings that face each other, and the head unit preferably grasps the pair of notches or openings of the placement member by the gripper, or grasps the pair of notches or openings of the placement member by a pair of grippers. According to this structure, in a state in which the gripper is positioned at a grasping position by the pair of notches or openings of the placement member, the pair of notches or openings of the placement member can be grasped, and thus positional deviation of the placement member can be effectively significantly reduced or prevented.

In the aforementioned structure in which the placement member includes the pair of notches or openings that face each other, the pair of notches or openings of the placement member each preferably include a guide having a shape that gradually tapers toward a grasping position of the gripper in the placement member to guide the gripper to the grasping position. According to this structure, in a state in which the gripper is reliably positioned at the grasping position by the guide of the placement member, the pair of notches or openings of the placement member can be grasped.

In the aforementioned structure in which the gripper is attached to the tip of the head, the gripper preferably includes a first gripper capable of holding the placement member at one point, and a second gripper capable of holding the placement member at two points, and the first gripper preferably holds one side of the placement member at the one point and the second gripper preferably holds another side of the placement member at the two points such that the head unit grasps the placement member in a three-point support manner. When one side of the placement member and another side of the placement member each are held at two points (four points in total), a gap may occur between the gripper and the placement member at any of the four grasping points of the gripper. Therefore, when the placement member is grasped in a three-point support manner, as described above, a gap can be prevented from occurring between the gripper and the placement member at any of the three grasping points. Consequently, the placement member can be grasped more stably.

In the aforementioned component mounting device according to this aspect, the controller preferably determines the head that holds the placement member among the plurality of heads based on information about a size of the placement member, information about a size of the mounting target placed on the placement member, and information about a distance between a pair of the heads. According to this structure, the head located at a position suitable for holding among the plurality of heads can hold the placement member according to the size of the placement member to be held and the size of the mounting target placed on this placement member. Consequently, when the placement member is held and transferred, positional deviation and fall of the placement member can be further significantly reduced or prevented.

In the aforementioned component mounting device according to this aspect, the controller preferably performs control of announcing a size of the placement member on which the mounting target is placed based on information about a size of the mounting target and information about a distance between a pair of the heads that hold the placement member. According to this structure, an operator can easily determine the placement member on which the mounting target to be produced next is placed among a plurality of types of placement members based on the announced size of the placement member.

The aforementioned component mounting device according to this aspect preferably further includes an imager that images the placement member held by the head of the head unit when the mounting target is transferred by the head unit, and the controller preferably acquires a state of the placement member held by the head of the head unit based on a result of imaging of the placement member by the imager. According to this structure, it can be confirmed whether or not the placement member is held by the head of the head unit (whether or not holding of the placement member is performed), for example, based on the acquired state of the placement member. When the placement member is not held, the retry operation of retrying the operation of holding the placement member can be quickly performed by the head unit, for example. Furthermore, for example, the positional deviation amount from the theoretical holding position of the placement member held by the head of the head unit can be acquired based on the acquired state of placement member, and the placement member can be transferred to the transfer position in a state in which the acquired positional deviation amount has been corrected. In addition, the placement member can be accurately transferred to the transfer position by correcting the positional deviation amount.

In the aforementioned component mounting device according to this aspect, the mounting target preferably has a three-dimensional shape as compared with a flat plate shape, the component mounting device preferably further includes a mounting target holder that holds the mounting target via the placement member and moves the held mounting target along an upward-downward direction, or rotates or inclines the held mounting target when the head unit performs mounting on the mounting target, and the controller preferably controls the transfer of the mounting target from the conveyance unit toward the mounting target holder by controlling the movement of the head unit in the horizontal plane in the state in which the placement member is held by the one or the plurality of heads of the head unit. According to this structure, when the mounting target having a complicated shape is transferred from the conveyance unit toward the mounting target holder, the mounting target can be transferred while the complexity of the device structure is significantly reduced or prevented. In addition, the mounting target is moved along the upward-downward direction, or is rotated or inclined by the mounting target holder such that mounting can be easily performed on even the mounting target having a complicated shape (three-dimensional shape).

According to the present disclosure, as described above, it is possible to provide the component mounting device capable of transferring the mounting target while significantly reducing or preventing the complexity of the device structure.

BRIEF DESCRIPTION OF THE DRAWINGS

FIG. 8 is a diagram illustrating control of determining heads that hold the placement member, performed by the component mounting device according to the first embodiment;

FIG. 9 is a diagram illustrating control of announcing the size of the placement member, performed by the component mounting device according to the first embodiment;

DETAILED DESCRIPTION

Embodiments embodying the present disclosure are hereinafter described on the basis of the drawings. In the following description, the conveyance direction of a placement member 90 (mounting target P) is defined as an X direction, a direction orthogonal to the X direction in a horizontal plane is defined as a Y direction, and an upward-downward direction orthogonal to the horizontal plane is defined as a Z direction. Furthermore, the upstream side in the conveyance direction is defined as the X1 direction side, and the downstream side in the conveyance direction is defined as the X2 direction side.

First Embodiment (Structure of Component Mounting Device)

The structure of a component mounting device 100 according to a first embodiment of the present disclosure is now described with reference to FIGS. 1 to 9.

Figure 1:
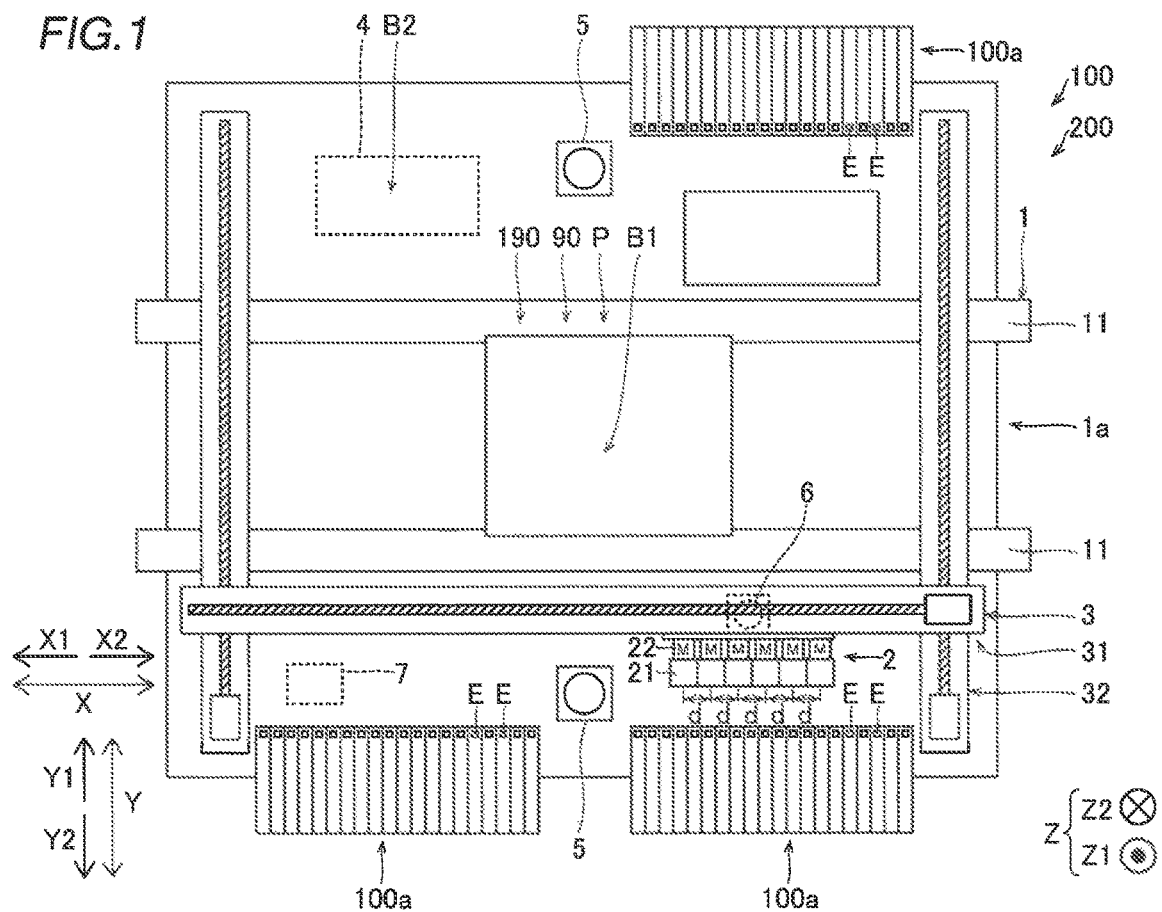
FIG. 1 is a plan view showing the overall structure of a component mounting device according to first and second embodiments.
Figure 2:
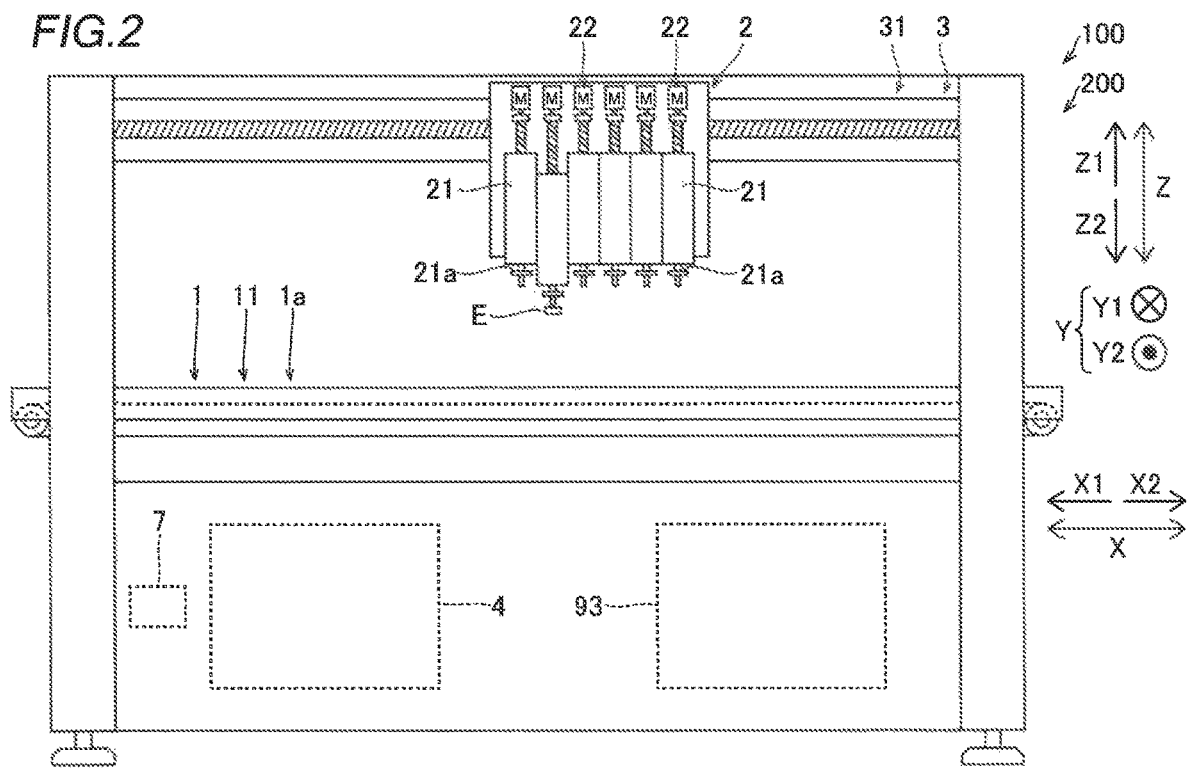
FIG. 2 is a side view showing the overall structure of the component mounting device according to the first and second embodiments.

As shown in FIGS. 1 and 2, the component mounting device 100 is a component mounting device that mounts components E (electronic components) such as ICs, transistors, capacitors, and resistors on the mounting target P such as a printed circuit board.

Figure 3:
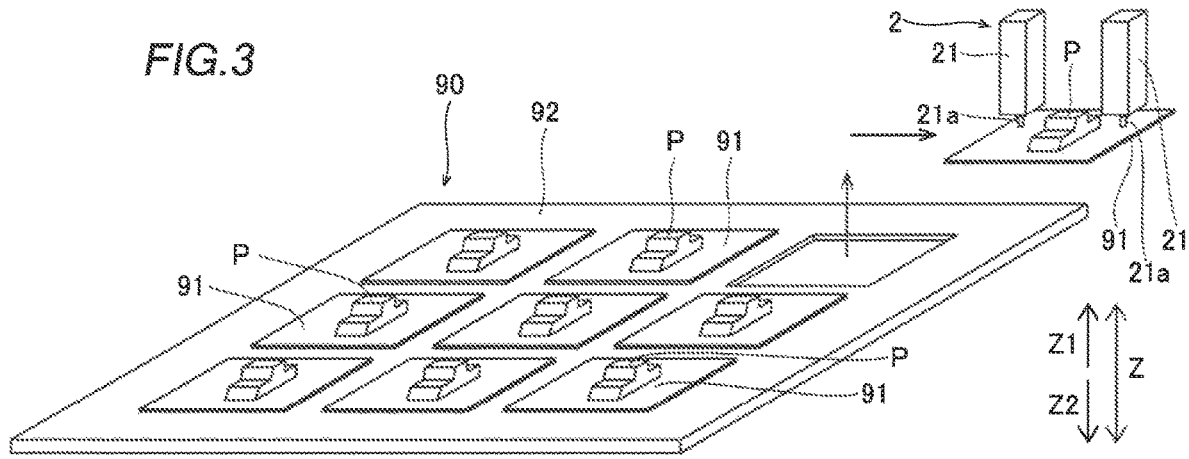
FIG. 3 is a perspective view showing a first placement portion of a placement member, a second placement portion of the placement member, and a mounting target according to the first embodiment.

In the component mounting device 100, as shown in FIG. 3, the mounting target P is carried into the device and conveyed in a state in which the same is placed on the placement member 90 for conveyance. In the first embodiment, the placement member 90 includes a plurality of first placement portions 91 and a single second placement portion 92. The mounting target P is placed on each of the plurality of first placement portions 91. The plurality of first placement portions 91 are placed on the second placement portion 92. In the component mounting device 100, the plurality of first placement portions 91 are placed on the single second placement portion 92 such that a plurality of mounting targets P can be carried into the component mounting device 100 at one time. In addition, the plurality of first placement portions 91 are removably placed on an upper portion of the second placement portion 92. In the component mounting device 100, a single first placement portion 91 can be separated from the second placement portion 92 of the placement member 90, and the mounting target P can be moved together with the separated first placement portion 91.

Figure 4:
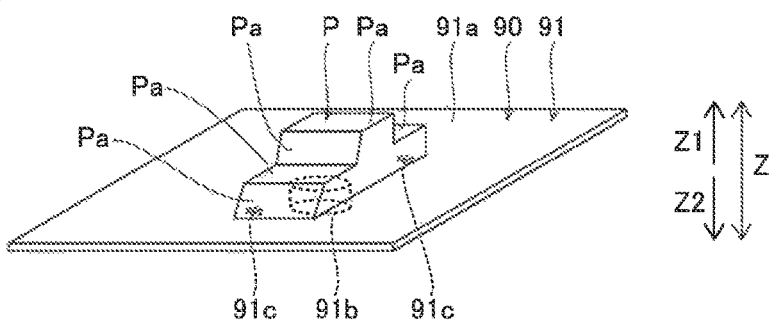
FIG. 4 is a perspective view showing the first placement portion of the placement member and the mounting target according to the first embodiment.

As shown in FIG. 4, the first placement portions 91 of the placement member 90 each include a placement portion 91a on which the mounting target P is placed, a held portion 91b that protrudes downward (Z2 direction) at a lower portion of the placement portion 91a and that is held by a mounting target holder 4 described below, and positioning portions 91c that position the mounting target P in the first placement portion 91. The positioning portions 91c include recesses (positioning holes) or protrusions (positioning pins), and the recesses or the protrusions of the positioning portions 91c engage with protrusions or recesses correspondingly provided on the mounting target P such that the mounting target P is positioned on the first placement portion 91. Furthermore, a plurality of (two) positioning portions 91c are provided. Thus, the positioning portions 91c prevent the mounting target P from rotating on the first placement portion 91. The number of positioning portions 91c is not restricted to two, but one or more than two positioning portions 91c may be provided. In the component mounting device 100, the components E are mounted on the mounting target P in a state in which the mounting target P is placed on the first placement portion 91 of the placement member 90.

In the present embodiment, the mounting target P has a three-dimensional shape as compared with a flat plate shape. The mounting target P may have any shape as long as the same has a three-dimensional shape as compared with a flat plate shape, and may have any number of mounting target surfaces Pa. In FIG. 4, as an example of the mounting target P, the mounting target P having a plurality of mounting target surfaces Pa including mounting target surfaces Pa that intersect with each other is illustrated. The mounting target P is not restricted to the example shown in FIG. 4, but the mounting target P may not have the mounting target surfaces Pa that intersect with each other.

As shown in FIGS. 1 and 2, the component mounting device 100 includes a conveyance unit 1, a head unit 2, a head horizontal movement mechanism 3, a mounting target holder 4, component imagers 5, a mark imager 6, and a controller 7. The component imagers 5 are examples of an "imager" in the claims.

The conveyance unit 1 is a conveyance device that carries in, conveys, and carries out the placement member 90 on which the mounting target P is placed. Specifically, the conveyance unit 1 includes a pair of conveyors 11 spaced apart from each other in the Y direction, and conveys the placement member 90 in the X direction while supporting, from below, both ends of the second placement portion 92 of the placement member 90 in the Y direction by the pair of conveyors 11. The conveyance unit 1 conveys the carried-in mounting target P to a transfer stop position B1, and stops the mounting target P at the transfer stop position B1.

The head unit 2 includes a plurality of (six) heads 21 that hold the components E and mount the held components E on the mounting target P, and is movable in the horizontal plane (in an X-Y plane) There is. In the component mounting device 100, a plurality of tape feeders 100a that supply the components E to be mounted on the mounting target P are disposed on both sides (the Y1 side and the Y2 side) in the Y direction. The heads 21 of the head unit 2 hold the components E supplied from the tape feeders 100a.

The plurality of heads 21 are arranged in a row at equal distance intervals (intervals d) along the X direction. The plurality of heads 21 have substantially the same structure. Suction nozzles 21a (see FIG. 2) that hold the components E are detachably attached to the tips of the heads 21. Furthermore, the heads 21 are connected to a vacuum source 93 (see FIG. 2) provided in the component mounting device 100. The suction nozzles 21a suction the components E by a negative pressure supplied from the vacuum source 93 such that the heads 21 hold the components E. The heads 21 release the holding (suction) of the components E due to stopping of supply of the negative pressure from the vacuum source 93 to mount the components E on the mounting target P.

The head unit 2 includes a plurality of head upward-downward movement mechanisms 22 provided for the respective heads 21. The plurality of head upward-downward movement mechanisms 22 have substantially the same structure. The head upward-downward movement mechanisms 22 move the heads 21 in the upward-downward direction (Z direction) by ball screw shaft mechanisms. Thus, the heads 21 are movable in the upward-downward direction between lowered positions at which the heads 21 are lowered to hold the components E or the first placement portions 91 of the placement member 90 and raised positions at which the heads 21 are raised to transfer the components E or the first placement portions 91 of the placement member 90.

The head horizontal movement mechanism 3 moves the head unit 2 in the horizontal plane (in the X-Y plane) above the placement member 90 (mounting target P). Specifically, the head horizontal movement mechanism 3 includes an X-axis movement mechanism 31 and a pair of Y-axis movement mechanisms 32.

The head unit 2 is attached to the X-axis movement mechanism 31, and the X-axis movement mechanism 31 moves the head unit 2 in the X direction by a ball screw shaft mechanism. The X-axis movement mechanism 31 is attached to the pair of Y-axis movement mechanisms 32, and the pair of Y-axis movement mechanisms 32 move the X-axis movement mechanism 31 and the head unit 2 in the Y direction by ball screw shaft mechanisms.

The mounting target holder 4 holds the mounting target P via the first placement portion 91 of the placement member 90 when the head unit 2 performs mounting on the mounting target P. Furthermore, the mounting target holder 4 moves the held mounting target P along the upward-downward direction (Z direction), or rotates or inclines the held mounting target P.

Figure 5:
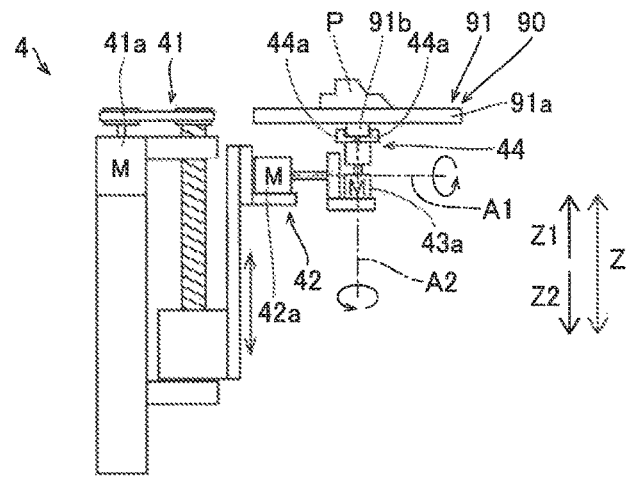
FIG. 5 is a diagram showing a mounting target holder of the component mounting device according to the first and second embodiments.

Specifically, as shown in FIG. 5, the mounting target holder 4 includes an elevation mechanism 41, an inclination mechanism 42, a rotation mechanism 43, and a holder 44. In the mounting target holder 4, the holder 44 is attached to the rotation mechanism 43, the rotation mechanism 43 is attached to the inclination mechanism 42, and the inclination mechanism 42 is attached to the elevation mechanism 41.

The elevation mechanism 41 includes a drive motor 41a, and moves the mounting target P held by the holder 44 along the upward-downward direction (Z direction) by the drive force of the drive motor 41a. The inclination mechanism 42 includes a drive motor 42a, and rotates the mounting target P held by the holder 44 about a rotation axis A1 that extends along a horizontal direction by the drive force of the drive motor 42a. Thus, the inclination mechanism 42 inclines the mounting target P held by the holder 44. The rotation mechanism 43 includes a drive motor 43a, and rotates the mounting target P held by the holder 44 about a rotation axis A2 that extends in a direction substantially orthogonal to the rotation axis A1 by the drive force of the drive motor 43a. The holder 44 holds the mounting target P via the first placement portion 91 of the placement member 90. Specifically, the holder 44 includes a plurality of claws 44a, and holds and fixes the held portion 91b of the first placement portion 91 of the placement member 90 by the plurality of claws 44a.

The component imagers 5 are cameras for component recognition that image the components E suctioned by the heads 21 prior to an operation for mounting the components E. The component imagers 5 are fixed to the upper surface of a base of the component mounting device 100, and image the components E suctioned by the heads 21 from the lower side (Z2 direction side) of the components E. The controller 7 acquires (recognizes) the suction states (the rotational orientations and the suction positions with respect to the heads 21) of the components E based on the results of imaging of the components E by the component imagers 5.

The mark imager 6 is a camera for mark recognition that images a position recognition mark (not shown) attached to the mounting target P prior to an operation for mounting the components E. The position recognition mark is a mark for recognizing the position of the mounting target P. The controller 7 acquires (recognizes) the accurate position and orientation of the mounting target P based on the result of imaging of the position recognition mark by the mark imager 6. In addition, the mark imager 6 is attached to the head unit 2, and is movable together with the head unit 2 in the horizontal plane (in the X-Y plane) above the placement member 90 (mounting target P).

The controller 7 includes a central processing unit (CPU), a read only memory (ROM), a random access memory (RAM), etc., and is a control circuit that controls the operation of the component mounting device 100. The controller 7 controls the operation of the conveyance unit 1, the head unit 2, the head horizontal movement mechanism 3, the component imagers 5, and the mark imager 6 according to a production program to mount the components E on the mounting target P.

(Structure Related to Transfer of Placement Member)

As shown in FIG. 1, in the component mounting device 100, the mounting target holder 4 is disposed outside a conveyance path 1a of the conveyance unit 1. That is, the mounting target holder 4 is disposed at a position to which the conveyance unit 1 cannot convey the mounting target P. Therefore, in the component mounting device 100, it is necessary to transfer the mounting target P from the conveyance unit 1 toward the mounting target holder 4.

Therefore, in the first embodiment, the controller 7 controls the head unit 2 to transfer the mounting target P from the conveyance unit 1 to the mounting target holder 4 as a transfer position B2 located at a position different from that of the conveyance unit 1. That is, in the first embodiment, the head unit 2 doubles as a head unit for component mounting and a head unit for transferring the mounting target.

Specifically, the controller 7 controls one or a plurality of heads 21 of the head unit 2 to hold the first placement portion 91 of the placement member 90, and controls the transfer of the mounting target P from the conveyance unit 1 to the transfer position B2 (mounting target holder 4) by controlling the movement of the head unit 2 in the horizontal plane and the raising and lowering of the heads 21 of the head unit 2 in a state in which the first placement portion 91 of the placement member 90 is held. Thus, the controller 7 controls the transfer of the mounting target P from the conveyance unit 1 toward the mounting target holder 4. Furthermore, the suction nozzles 21a for component mounting attached to one or the plurality of heads 21 suction an upper portion of the first placement portion 91 of the placement member 90 such that the head unit 2 holds the placement member 90.

<When One Head Transfers Placement Member>

Figure 6:
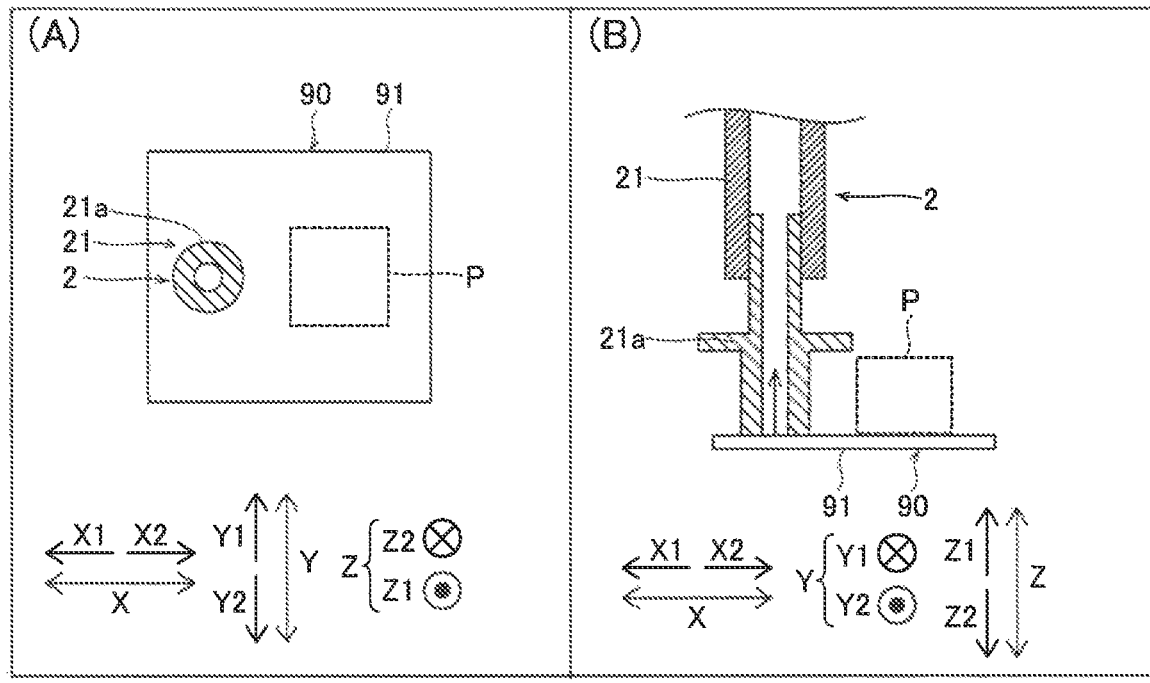
FIG. 6 shows a plan view in Section (A) and a side view in Section (B) illustrating the state of the placement member held by one head of the component mounting device according to the first embodiment.

As shown in Sections (A) and (B) of FIG. 6, first, the controller 7 controls the lowering of one head 21 toward the first placement portion 91 of the placement member 90 stopped at the transfer stop position B1, and controls one head 21 to hold the first placement portion 91 of the placement member 90. Specifically, the controller 7 controls a suction nozzle 21a of one head 21 to suction the upper portion of the first placement portion 91 of the placement member 90 so as to control one head 21 to hold the first placement portion 91 of the placement member 90.

Then, the controller 7 controls the raising of one head 21 that holds the first placement portion 91 of the placement member 90. Then, the controller 7 controls the movement of the head unit 2 to a position above the transfer position B2 (mounting target holder 4) by moving the head unit 2 in the horizontal plane. Then, the controller 7 controls the lowering of one head 21 that holds the first placement portion 91 of the placement member 90 toward the transfer position B2 (mounting target holder 4). Then, the controller 7 controls one head 21 to release the holding (suction) of the first placement portion 91 of the placement member 90 so as to control the transfer of the first placement portion 91 of the placement member 90 to the transfer position B2 (mounting target holder 4). The first placement portion 91 of the placement member 90 that has been transferred is held by the mounting target holder 4 at the transfer position B2.

<When Plurality of Heads Transfer Placement Member>

Figure 7:
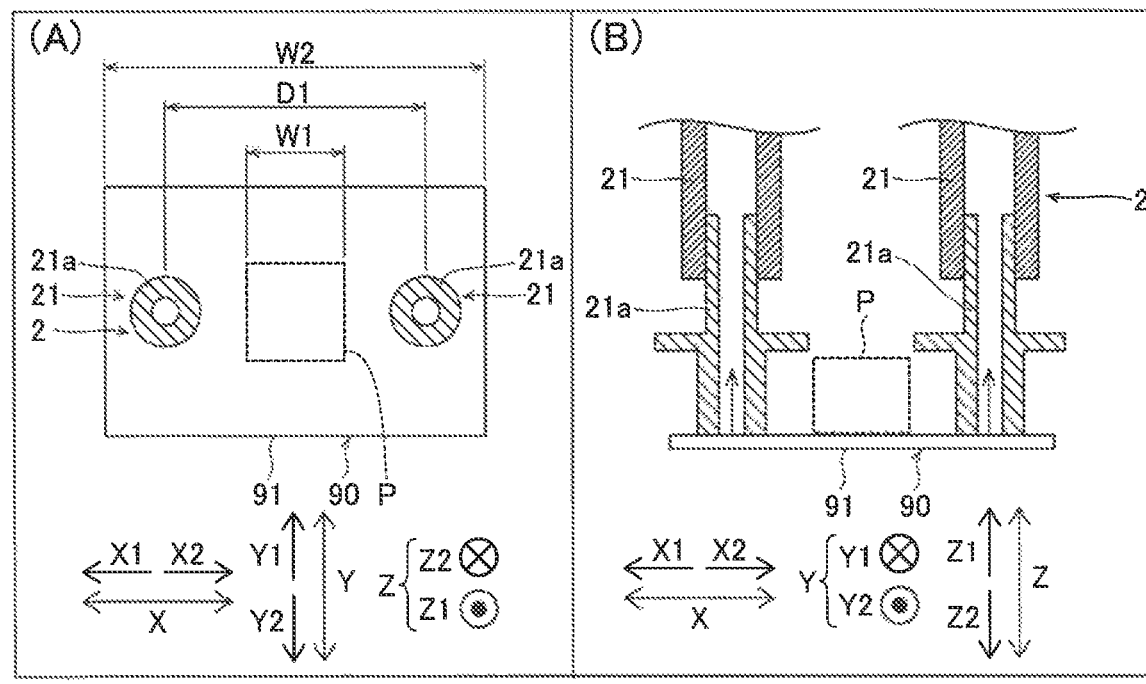
FIG. 7 shows a plan view in Section (A) and a side view in Section (B) illustrating the state of the placement member held by a pair of heads of the component mounting device according to the first embodiment.

As shown in Sections (A) and (B) of FIG. 7, the controller 7 controls a pair of heads 21 to hold the first placement portion 91 of the placement member 90 in such a manner as to sandwich the mounting target P when the plurality of heads 21 hold the first placement portion 91 of the placement member 90. Even when the pair of heads 21 hold and transfer the first placement portion 91 of the placement member 90, the operation is basically the same as when one head holds and transfers the first placement portion 91 of the placement member 90.

That is, first, the controller 7 controls the synchronous lowering of the pair of heads 21 toward the first placement portion 91 of the placement member 90 stopped at the transfer stop position B1, and controls the pair of heads 21 to hold the first placement portion 91 of the placement member 90. Specifically, the controller 7 controls the suction nozzles 21a of the pair of heads 21 to suction two positions on the upper portion of the first placement portion 91 of the placement member 90 so as to control the pair of heads 21 to hold the first placement portion 91 of the placement member 90.

Then, the controller 7 controls the synchronous raising of the pair of heads 21 that hold the first placement portion 91 of the placement member 90. Then, the controller 7 controls the movement of the head unit 2 to the position above the transfer position B2 (mounting target holder 4) by moving the head unit 2 in the horizontal plane. Then, the controller 7 controls the lowering of the pair of heads 21 that hold the first placement portion 91 of the placement member 90 toward the transfer position B2 (mounting target holder 4). Then, the controller 7 controls the pair of heads 21 to release the holding (suction) of the first placement portion 91 of the placement member 90 so as to control the transfer of the first placement portion 91 of the placement member 90 to the transfer position B2 (mounting target holder 4). The first placement portion 91 of the placement member 90 that has been transferred is held by the mounting target holder 4 at the transfer position B2.

In the first embodiment, as shown in FIGS. 7 and 8, the controller 7 determines the pair of (two) heads 21 that hold the first placement portion 91 of the placement member 90 among the plurality of (six) heads 21 based on information about the size of the first placement portion 91 of the placement member 90, information about the size of the mounting target P placed on the first placement portion 91 of the placement member 90, and information about a distance between the pair of heads 21. At this time, the controller 7 acquires the width W1 of the mounting target P in the X direction (the arrangement direction of the heads 21) as the information about the size of the mounting target P placed on the first placement portion 91 of the placement member 90. The controller 7 acquires the width W2 of the first placement portion 91 of the placement member 90 in the X direction as the information about the size of the first placement portion 91 of the placement member 90. The controller 7 acquires a distance D1 between the pair of heads 21 as the information about the distance between the pair of heads 21 that hold the first placement portion 91 of the placement member 90.

Specifically, the controller 7 determines the pair of (two) heads 21 that hold the first placement portion 91 of the placement member 90 among the plurality of (six) heads 21 such that the relationship between the distance D1 between the pair of heads 21 that hold the first placement portion 91 of the placement member 90, the width W1 of the mounting target P in the X direction (the arrangement direction of the heads 21), and the width W2 of the first placement portion 91 of the placement member 90 in the X direction satisfies W1<D1<W2.

For example, it is assumed that a distance d between heads 21 adjacent to each other is 30 mm. In such a case, when the width W1 is 20 mm and the width W2 is 40 mm, for example, two heads 21 spaced apart by a distance d (D1)=30 mm without sandwiching another head 21 are determined as a pair of heads 21 for transfer. When the width W1 is 50 mm and the width W2 is 70 mm, for example, two heads 21 spaced apart by a distance 2d (D1)=60 mm while sandwiching one head 21 are determined as a pair of heads 21 for transfer. When the width W1 is 80 mm and the width W2 is 100 mm, for example, two heads 21 spaced apart by a distance 3d (D1)=90 mm while sandwiching two heads 21 are determined as a pair of heads 21 for transfer.

When the width W2 of the first placement portion 91 of the placement member 90 in the X direction is smaller than d, which is a minimum distance between the pair of heads 21 in the head unit 2 (when W2<d), one head 21 holds and transfers the first placement portion 91 of the placement member 90, as described above.

<Acquisition of State of Placement Member Held by Head>

In the first embodiment, the component imagers 5 image the first placement portion 91 of the placement member 90 held by the head(s) 21 of the head unit 2 from below (Z2 direction) when the head unit 2 transfers the mounting target P from the conveyance unit 1 to the transfer position B2 (mounting target holder 4). The controller 7 acquires the state of the first placement portion 91 of the placement member 90 held by the head(s) 21 of the head unit 2 based on the results of imaging of the first placement portion 91 of the placement member 90 by the component imagers 5.

The controller 7 determines whether or not the first placement portion 91 of the placement member 90 is held by the head(s) 21 of the head unit 2 based on the acquired state of the first placement portion 91 of the placement member 90. When determining that the first placement portion 91 of the placement member 90 is held by the head(s) 21 of the head unit 2, the controller 7 controls the head unit 2 to continue the operation of transferring the first placement portion 91 of the placement member 90. On the other hand, when determining that the first placement portion 91 of the placement member 90 is not held by the head(s) 21 of the head unit 2, the controller 7 controls the head unit 2 to perform the retry operation of retrying the operation of holding the first placement portion 91 of the placement member 90, for example.

The controller 7 acquires the positional deviation amount from the theoretical holding position of the first placement portion 91 of the placement member 90 held by the head(s) 21 of the head unit 2 based on the acquired state of the first placement portion 91 of the placement member 90, and transfers the first placement portion 91 of the placement member 90 to the transfer position B2 (mounting target holder 4) in a state in which the acquired positional deviation amount has been corrected.

<Announcement of Size of Placement Member>

In the first embodiment, as shown in FIG. 9, the controller 7 performs control of announcing the size of the first placement portion 91 of the placement member 90 on which the mounting target P to be produced next is placed based on the information about the size of the mounting target P to be produced next and the information about the distance between the pair of heads 21 that hold the first placement portion 91 of the placement member 90. At this time, the controller 7 acquires the width W1 of the mounting target P to be produced next in the X direction (the arrangement direction of the heads 21) as the information about the size of the mounting target P to be produced next. Furthermore, the controller 7 acquires the distance D1, which is a minimum distance between the pair of heads 21 among distances between pairs of heads 21 larger than the width W1 of the mounting target P to be produced next, as the information about the distance between the pair of heads that hold the first placement portion 91 of the placement member 90. The controller 7 announces the width W2 of the first placement portion 91 of the placement member 90 in the X direction larger than the distance D1 as the size of the first placement portion 91 of the placement member 90 on which the mounting target P to be produced next is placed.

For example, it is assumed that the distance d between the heads 21 adjacent to each other is 30 mm. In such a case, when the width W1 is 20 mm, for example, d=30 mm is acquired as the distance D1, and 40 mm is announced as the width W2. When the width W1 is 40 mm, for example, 2d=60 mm is acquired as the distance D1, and 70 mm is announced as the width W2. When the width W1 is 70 mm, for example, 3d=90 mm is acquired as the distance D1, and 100 mm is announced as the width W2.

(Mounting Processing)

Figure 10:
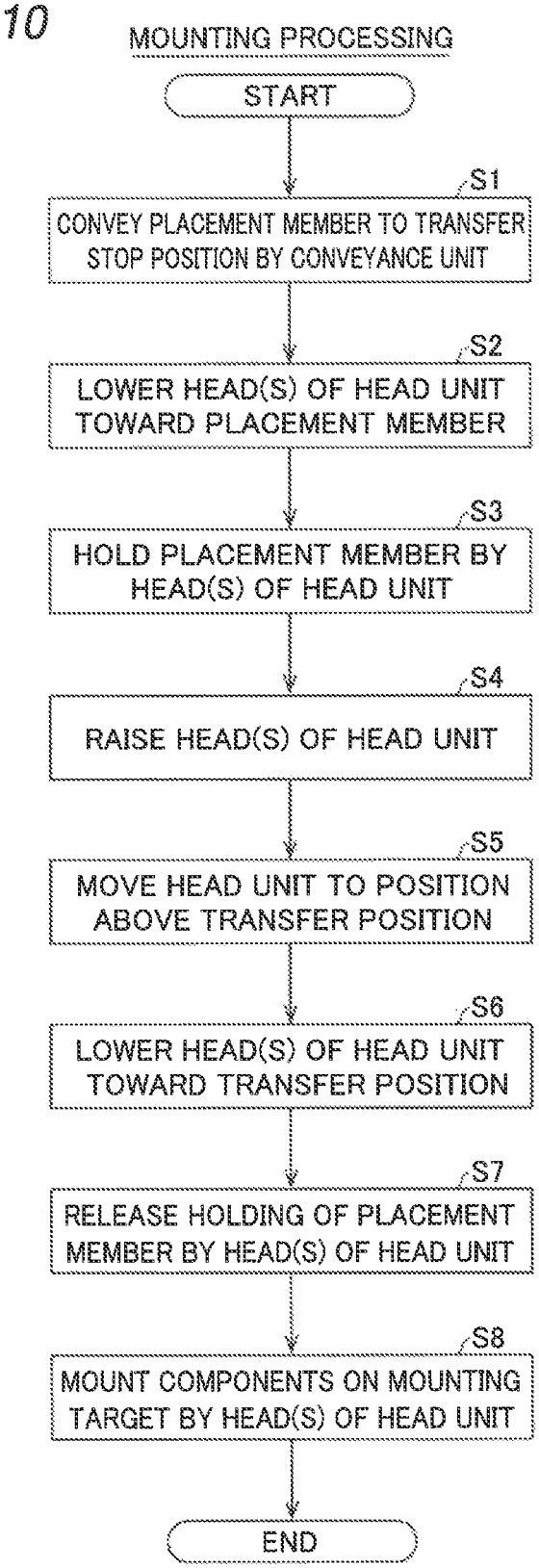
FIG. 10 is a flowchart illustrating mounting processing performed by the component mounting device according to the first embodiment.

Mounting processing performed by the component mounting device 100 is now described based on a flowchart with reference to FIG. 10. Each step in the flowchart is performed by the controller 7.

As shown in FIG. 10, first, in step S1, the placement member 90 is carried in and conveyed to the transfer stop position B1 by the conveyance unit 1.

Next, in step S2, the head(s) 21 (one or the pair of heads 21) of the head unit 2 is lowered toward the first placement portion 91 of the plurality of first placement portions 91 of the placement member 90 stopped at the transfer stop position B1. When the pair of heads 21 are lowered, the pair of heads 21 are synchronously lowered.

Next, in step S3, the first placement portion 91 of the placement member 90 is suctioned by the suction nozzle 21a of the head(s) 21 of the head unit 2 so as to be held by the head(s) 21 of the head unit 2.

Next, in step S4, the head(s) 21 of the head unit 2 that holds the first placement portion 91 of the placement member 90 is raised. When the pair of heads 21 are raised, the pair of heads 21 are synchronously raised.

Next, in step S5, the head unit 2 is moved in the horizontal plane to the position above the transfer position B2 (mounting target holder 4).

Next, in step S6, the head(s) 21 of the head unit 2 that holds the first placement portion 91 of the placement member 90 is lowered toward the transfer position B2 (mounting target holder 4). When the pair of heads 21 are lowered, the pair of heads 21 are synchronously lowered.

Next, in step S7, the holding of the first placement portion 91 of the placement member 90 by the head(s) 21 of the head unit 2 is released, and the first placement portion 91 of the placement member 90 is held by the mounting target holder 4.

Next, in step S8, the head(s) 21 of the head unit 2 mounts the components E on the mounting target P held by the mounting target holder 4. In step S8, the mounting target P is moved along the upward-downward direction, or is rotated or inclined by the mounting target holder 4 such that the orientations and the positions of the mounting target surfaces Pa of the mounting target P enable the head(s) 21 of the head unit 2 to perform mounting. For example, the mounting target P is rotated or inclined such that the mounting target surfaces Pa of the mounting target P are substantially parallel to the horizontal plane. In addition, for example, the mounting target P is moved in the upward-downward direction such that the mounting target surfaces Pa of the mounting target P are located at heights at which the head unit 2 can perform mounting. When the mounting operation on the mounting target P is completed, the mounting target P (the first placement portion 91 of the placement member 90) is disposed, by the mounting target holder 4, at a predetermined position at which the mounting target P can be held by the head(s) 21 of the head unit 2. Then, the first placement portion 91 of the placement member 90 on which the mounting target P after mounting is placed is transferred from the transfer position B2 to the conveyance unit 1 by the head(s) 21 of the head unit 2. Then, the mounting processing is terminated.

Effects of First Embodiment

According to the first embodiment, the following effects are achieved.

According to the first embodiment, as described above, the controller 7 controls the transfer of the mounting target P from the conveyance unit 1 to the transfer position B2 (mounting target holder 4) located at a position different from that of the conveyance unit 1 by controlling the movement of the head unit 2 in the horizontal plane in a state in which the first placement portion 91 of the placement member 90 is held by one or the plurality of heads 21 of the head unit 2. Accordingly, the mounting target P (the first placement portion 91 of the placement member 90) can be transferred from the conveyance unit 1 to the transfer position B2 (mounting target holder 4) by the head unit 2 that mounts the components E, and thus it is not necessary to separately provide a dedicated device for transferring the mounting target P. Consequently, the mounting target P can be transferred while the complexity of the device structure is significantly reduced or prevented. Furthermore, when the mounting target P is transferred, the head unit 2 holds not the mounting target P itself but the first placement portion 91 of the placement member 90 on which the mounting target P is placed such that as compared with the case in which the mounting target P is directly held by the head unit 2, the degree of freedom in selecting a holding position of the head unit 2 can be improved.

According to the first embodiment, as described above, the controller 7 controls the lowering of the plurality of heads 21 toward the first placement portion 91 of the placement member 90, and the synchronous raising of the plurality of heads 21 that hold the first placement portion 91 of the placement member 90 after controlling the plurality of heads 21 to hold the first placement portion 91 of the placement member 90. Accordingly, the first placement portion 91 of the placement member 90 can be raised by the plurality of heads 21 while a good holding state is maintained. Consequently, when the first placement portion 91 of the placement member 90 is raised by the plurality of heads 21, positional deviation and fall of the first placement portion 91 of the placement member 90 can be significantly reduced or prevented.

According to the first embodiment, as described above, the controller 7 controls the pair of heads 21 to hold the first placement portion 91 of the placement member 90 in such a manner as to sandwich the mounting target P when the plurality of heads 21 hold the first placement portion 91 of the placement member 90. Accordingly, the first placement portion 91 of the placement member 90 can be held by the pair of heads 21 at symmetrical positions across the mounting target P, and thus the first placement portion 91 of the placement member 90 can be held in a balanced manner Consequently, when the first placement portion 91 of the placement member 90 is transferred, positional deviation and fall of the first placement portion 91 of the placement member 90 can be significantly reduced or prevented.

According to the first embodiment, as described above, the suction nozzles 21a are attached to the tips of the heads 21. Furthermore, the suction nozzles 21a attached to one or the plurality of heads 21 suction the first placement portion 91 of the placement member 90 such that the head unit 2 holds the first placement portion 91 of the placement member 90. Accordingly, the first placement portion 91 of the placement member 90 can be held only by suctioning the first placement portion 91 of the placement member 90, and thus the heads 21 of the head unit 2 can easily hold the first placement position 91 of the placement member 90. Furthermore, the first placement portion 91 of the placement member 90 is held by the suction nozzles 21a that hold the components E such that the suction nozzles 21a can be shared, and thus an increase in the number of components due to transfer of the first placement portion 91 of the placement member 90 can be significantly reduced or prevented. Moreover, the degree of freedom in selecting the holding position (suction position) of the head unit 2 can be improved.

According to the first embodiment, as described above, the controller 7 determines the head(s) 21 that holds the first placement portion 91 of the placement member 90 among the plurality of heads 21 based on the information about the size of the first placement portion 91 of the placement member 90, the information about the size of the mounting target P placed on the first placement portion 91 of the placement member 90, and the information about the distance between the pair of heads 21. Accordingly, the head(s) 21 located at a position suitable for holding among the plurality of heads 21 can hold the first placement portion 91 of the placement member 90 according to the size of the first placement portion 91 of the placement member 90 to be held and the size of the mounting target P placed on this first placement portion 91 of the placement member 90. Consequently, when the first placement portion 91 of the placement member 90 is held and transferred, positional deviation and fall of the first placement portion 91 of the placement member 90 can be further significantly reduced or prevented.

According to the first embodiment, as described above, the controller 7 performs control of announcing the size of the first placement portion 91 of the placement member 90 on which the mounting target P is placed based on the information about the size of the mounting target P and the information about the distance between the pair of heads 21 that hold the first placement portion 91 of the placement member 90. Accordingly, an operator can easily determine the first placement portion 91 of the placement member 90 on which the mounting target P to be produced next is placed among first placement portions 91 of a plurality of types of placement members 90 based on the announced size of the first placement portion 91 of the placement member 90.

According to the first embodiment, as described above, the component mounting device 100 includes the component imagers 5 that image the first placement portion 91 of the placement member 90 held by the head(s) 21 of the head unit 2 when the mounting target P is transferred by the head unit 2. Furthermore, the controller 7 acquires the state of the first placement portion 91 of the placement member 90 held by the head(s) 21 of the head unit 2 based on the results of imaging of the first placement portion 91 of the placement member 90 by the component imagers 5. Accordingly, it can be confirmed whether or not the first placement portion 91 of the placement member 90 is held by the head(s) 21 of the head unit 2 (whether or not holding of the first placement portion 91 of the placement member 90 is performed) based on the acquired state of the first placement portion 91 of the placement member 90. When the first placement portion 91 of the placement member 90 is not held, the retry operation of retrying the operation of holding the first placement portion 91 of the placement member 90 can be quickly performed by the head unit 2, for example. Furthermore, the positional deviation amount from the theoretical holding position of the first placement portion 91 of the placement member 90 held by the head(s) 21 of the head unit 2 can be acquired based on the acquired state of the first placement portion 91 of the placement member 90, and the first placement portion 91 of the placement member 90 can be transferred to the transfer position in a state in which the acquired positional deviation amount has been corrected. In addition, the first placement portion 91 of the placement member 90 can be accurately transferred to the transfer position by correcting the positional deviation amount.

According to the first embodiment, as described above, the mounting target P has a three-dimensional shape as compared with a flat plate shape. The component mounting device 100 includes the mounting target holder 4 that holds the mounting target P via the first placement portion 91 of the placement member 90 and moves the held mounting target P along the upward-downward direction, or rotates or inclines the held mounting target P when the head unit 2 performs mounting on the mounting target P. Furthermore, the controller 7 controls the transfer of the mounting target P from the conveyance unit 1 toward the mounting target holder 4 by controlling the movement of the head unit 2 in the horizontal plane in a state in which the first placement portion 91 of the placement member 90 is held by one or the plurality of heads 21 of the head unit 2. Accordingly, when the mounting target P having a complicated shape is transferred from the conveyance unit 1 toward the mounting target holder 4, the mounting target P can be transferred while the complexity of the device structure is significantly reduced or prevented. In addition, the mounting target P is moved along the upward-downward direction, or is rotated or inclined by the mounting target holder 4 such that mounting can be easily performed on even the mounting target P having a complicated shape (three-dimensional shape).

Second Embodiment

A second embodiment is now described with reference to FIGS. 1, 2, and 11 to 13. In this second embodiment, an example in which a first placement portion of a placement member is held by grasping unlike the aforementioned first embodiment is described. The same structures as those of the aforementioned first embodiment are denoted by the same reference numerals in the figures, and description thereof is omitted.

(Structure of Component Mounting Device)

Figure 11:
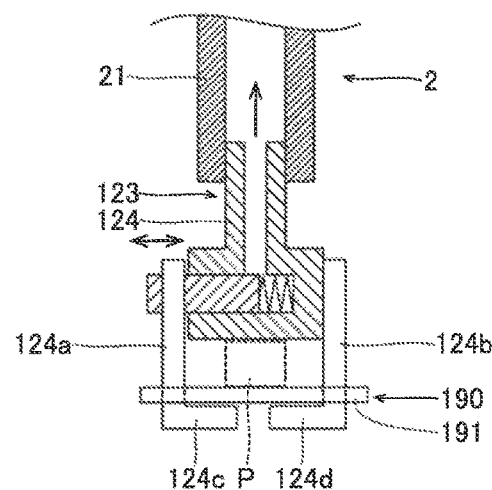
FIG. 11 is a side view illustrating the state of a placement member held by one head of the component mounting device according to the second embodiment.
Figure 12:
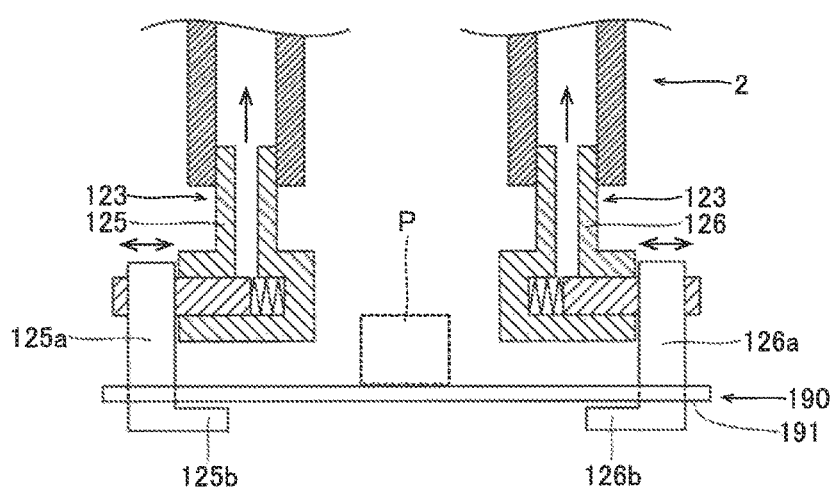
FIG. 12 is a side view illustrating the state of the placement member held by a pair of heads of the component mounting device according to the second embodiment.

A component mounting device 200 (see FIGS. 1 and 2) according to the second embodiment of the present disclosure differs from the component mounting device 100 according to the aforementioned first embodiment in that a gripper(s) 123 is detachably attached to the tip(s) of a head(s) 21 of a head unit 2, as shown in FIGS. 11 and 12.

In the second embodiment, the grippers 123 attached to one or a plurality of heads 21 each grasp a pair of facing portions (a pair of notches 191c described below) of a first placement portion 191 of a placement member 190 such that the head unit 2 holds the first placement portion 191 of the placement member 190. The grippers 123 are disposed together with suction nozzles 21a in nozzle changers (not shown) provided in the component mounting device 200. When the first placement portion 191 of the placement member 190 is transferred by the head unit 2, the suction nozzles 21a attached to the heads 21 of the head unit 2 are changed out for the grippers 123.

The grippers 123 include a gripper 124 (see FIG. 11) that grasps the first placement portion 191 of the placement member 190, and a pair of grippers 125 and 126 (see FIG. 12) that grasp the first placement portion 191 of the placement member 190. The grippers 125 and 126 are examples of a "first gripper" and a "second gripper" in the claims, respectively.

As shown in FIG. 11, the gripper 124 is attached to the tip of one head 21 when the first placement portion 191 of the placement member 190 is grasped and transferred by the head 21. The gripper 124 includes a pair of gripping portions 124a and 124b that face each other in an X direction, and grasps the first placement portion 191 of the placement member 190 by the pair of gripping portions 124a and 124b.

The gripping portion 124a of the gripper 124 on one side (X1 direction side) is movable in the X direction (a direction in which the gripping portions 124a and 124b face each other) between a grasping position at which the gripping portion 124a grasps the first placement portion 191 of the placement member 190 and a retracted position at which the gripping portion 124a does not grasp the first placement portion 191 of the placement member 190. On the other hand, the gripping portion 124b of the gripper 124 on another side (X2 direction side) is fixed. The gripper 124 grasps the first placement portion 191 of the placement member 190 between the gripping portion 124a and the gripping portion 124b by moving the gripping portion 124a from the retracted position to the grasping position.

The gripping portion 124a moves from the retracted position to the grasping position by a negative pressure supplied from a vacuum source 93 (see FIG. 2). In addition, the gripping portion 124a moves from the grasping position to the retracted position when the supply of the negative pressure from the vacuum source 93 is stopped. Thus, the vacuum source 93 provided to hold components E can be used to move the gripping portion 124a.

The gripping portions 124a and 124b respectively include receiving portions 124c and 124d that prevent the first placement portion 191 of the placement member 190 from falling. In a state in which the receiving portions 124c and 124d hold the first placement portion 191 of the placement member 190, both the receiving portions 124c and 124d face a lower portion of the first placement portion 191 of the placement member 190 in an upward-downward direction (Z direction) below the first placement portion 190 of the placement member 190.

As shown in FIG. 12, the pair of grippers 125 and 126 are attached to the tips of a pair of heads 21 when the first placement portion 191 of the placement member 190 is grasped and transferred by the pair of heads 21. The grippers 125 and 126 include one gripping portion 125a and one gripping portion 126a, respectively. The pair of grippers 125 and 126 grasp the first placement portion 191 of the placement member 190 by the gripping portion 125a of the gripper 125 and the gripping portion 126a of the gripper 126.

The gripping portion 125a (126a) of the gripper 125 (126) is movable in the X direction (a direction in which the gripping portions 125a and 126a face each other) between a grasping position at which the gripping portion 125a (126a) grasps the first placement portion 191 of the placement member 190 and a retracted position at which the gripping portion 125a (126a) does not grasp the first placement portion 191 of the placement member 190. A movement mechanism of the gripping portion 125a (126a) of the gripper 125 (126) is the same as a movement mechanism of the gripping portion 124a of the gripper 124, and thus description thereof is omitted. Furthermore, the gripping portion 125a (126a) includes a receiving portion 125b (126b) that prevents the first placement portion 191 of the placement member 190 from falling, similarly to the gripping portion 124a (124b) of the gripper 124.

Figure 13:
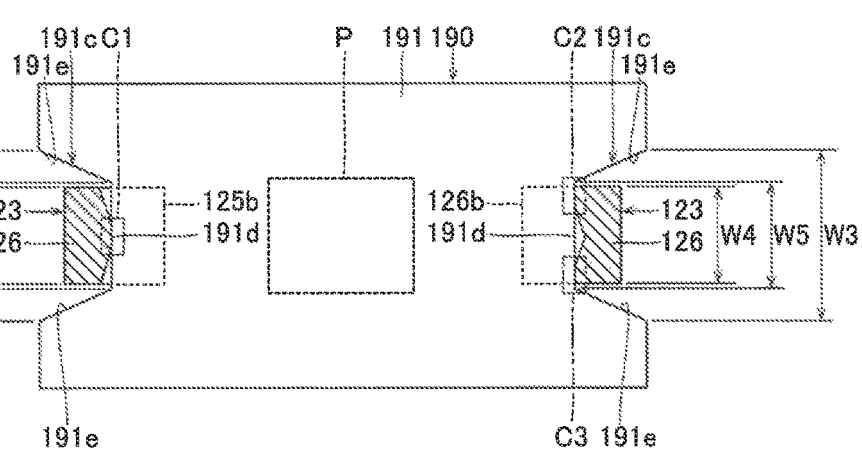
FIG. 13 is a plan view illustrating a first placement portion of the placement member according to the second embodiment.

In the second embodiment, as shown in FIG. 13, the gripper 125 can hold the first placement portion 191 of the placement member 190 at one point (grasping point C1), and the gripper 126 can hold the first placement portion 191 of the placement member 190 at two points (grasping points C2 and C3) on the side (X2 direction side) opposite to the side (X1 direction side) on which the gripper 125 holds the first placement portion 191 of the placement member 190. Thus, the gripper 125 holds one side (X1 direction side) of the first placement portion 191 of the placement member 190 at one point, and the gripper 126 holds another side (X2 direction side) of the first placement portion 191 of the placement member 190 at two points such that the head unit 2 grasps the first placement portion 191 of the placement member 190 in a three-point support manner. The head unit 2 grasps the first placement portion 191 of the placement member 190 in a three-point support manner such that the three grasping points of the grippers 125 and 126 are at three vertex positions of an isosceles triangle, respectively.

In the second embodiment, the first placement portion 191 of the placement member 190 includes the pair of notches 191c that face each other in the X direction. The head unit 2 grasps the pair of notches 191c of the first placement portion 191 of the placement member 190 by the pair of gripping portions 124a and 124b of one gripper 124, or grasps the pair of notches 191c of the first placement portion 191 of the placement member 190 by the pair of grippers 125 and 126.

The pair of notches 191c each include a guide 191e having a shape that gradually tapers toward a grasping position 191d of the gripper 124 (125, 126) in the placement member 190. The guide 191e guides the gripper 124 (125, 126) to the grasping position 191d by guiding the gripping portion 124a (124b, 125a, 126a) of the gripper 124 (125, 126) along the gradually tapering shape.

In a Y direction, the width W3 of the entrance of each of the notches 191c is larger than the width W4 of the gripper 125 (126). Furthermore, in the Y direction, the width W5 of each of the notches 191c at the grasping position 191d is smaller than the width W3 of the entrance of each of the notches 191c, and is equal to or more than the width W4 of the gripper 125 (126). Specifically, in the Y direction, the width W5 of each of the notches 191c at the grasping position 191d is substantially the same as or slightly larger than the width W4 of the gripper 125 (126).

The remaining structures of the second embodiment are similar to those of the aforementioned first embodiment.

(Effects of Second Embodiment)

According to the second embodiment, the following effects are achieved.

According to the second embodiment, as described above, the grippers 123 are attached to the tips of the heads 21. Furthermore, the grippers 123 attached to one or the plurality of heads 21 each grasp the pair of facing portions (pair of notches 191c) of the first placement portion 191 of the placement member 190 such that the head unit 2 holds the first placement portion 191 of the placement member 190. Accordingly, the first placement portion 191 of the placement member 190 can be held more stably as compared with the case in which the first placement portion 191 of the placement member 190 is held by suction, and thus when the first placement portion 191 of the placement member 190 is held and transferred, positional deviation and fall of the first placement portion 191 of the placement member 190 can be further significantly reduced or prevented.

According to the second embodiment, as described above, the first placement portion 191 of the placement member 190 includes the pair of notches 191c that face each other. Furthermore, the head unit 2 grasps the pair of notches 191c of the first placement portion 191 of the placement member 190 by one gripper 124, or grasps the pair of notches 191c of the first placement portion 191 of the placement member 190 by the pair of grippers 125 and 126. Accordingly, in a state in which the gripper 124 (125, 126) is positioned at the grasping position 191e by the pair of notches 191c of the first placement portion 191 of the placement member 190, the pair of notches 191c of the first placement portion 191 of the placement member 190 can be grasped, and thus positional deviation of the first placement portion 191 of the placement member 190 can be effectively significantly reduced or prevented.

According to the second embodiment, as described above, the pair of notches 191c of the first placement portion 191 of the placement member 190 each include the guide 191e having a shape that gradually tapers toward the grasping position 191d of the gripper 124 (125, 126) in the first placement portion 191 of the placement member 190 to guide the gripper 123 to the grasping position 191d. Accordingly, in a state in which the gripper 124 (125, 126) is reliably positioned at the grasping position 191d by the guide 191e of the first placement portion 191 of the placement member 190, the pair of notches 191c of the first placement portion 191 of the placement member 190 can be grasped.

According to the second embodiment, as described above, the grippers 123 include the gripper 125 capable of holding the first placement portion 191 of the placement member 190 at one point, and the second gripper 126 capable of holding the first placement portion 191 of the placement member 190 at two points. Furthermore, the gripper 125 holds one side of the first placement portion 191 of the placement member 190 at one point, and the gripper 126 holds another side of the first placement portion 191 of the placement member 190 at two points such that the head unit 2 grasps the first placement portion 191 of the placement member 190 in a three-point support manner. When one side of the first placement portion 191 of the placement member 190 and another side of the first placement portion 191 of the placement member 190 each are held at two points (four points in total), a gap may occur between the gripper and the first placement portion 191 of the placement member 190 at any of the four grasping points of the grippers. Therefore, when the first placement portion 191 of the placement member 190 is grasped in a three-point support manner, as described above, a gap can be prevented from occurring between the gripper 125 or 126 and the first placement portion 191 of the placement member 190 at any of the three grasping points. Consequently, the first placement portion 191 of the placement member 190 can be grasped more stably.

The remaining effects of the second embodiment are similar to those of the aforementioned first embodiment.

MODIFIED EXAMPLES

The embodiments disclosed this time must be considered as illustrative in all points and not restrictive. The scope of the present disclosure is not shown by the above description of the embodiments but by the scope of claims for patent, and all modifications (modified examples) within the meaning and scope equivalent to the scope of claims for patent are further included.

For example, while the example in which the mounting target having a three-dimensional shape as compared with a flat plate shape is used as the mounting target has been shown in each of the aforementioned first and second embodiments, the present disclosure is not restricted to this. According to the present disclosure, the mounting target may not have a three-dimensional shape as compared with a flat plate shape, as long as the same is conveyed in a state in which the same is placed on the placement member. For example, the mounting target may be a printed circuit board (rigid board or flexible board) having a flat plate shape and placed on the placement member.

While the example in which the head unit includes the plurality of heads arranged in a row has been shown in each of the aforementioned first and second embodiments, the present disclosure is not restricted to this. For example, the head unit may be a so-called rotary head unit including a plurality of circularly arranged heads.

While the example in which the transfer position is the mounting target holder has been shown in each of the aforementioned first and second embodiments, the present disclosure is not restricted to this. According to the present disclosure, the transfer position may be a position other than the mounting target holder.

While the example in which the placement member including the plurality of first placement portions on which the plurality of mounting targets are placed and the second placement portion on which the plurality of first placement portions are placed is carried in, and the first placement portion of the placement member is transferred by the head unit has been shown in each of the aforementioned first and second embodiments, the present disclosure is not restricted to this. For example, a single placement member on which a single mounting target is placed may be carried in, and the carried-in single placement member may be transferred by the head unit.

While the example in which the suction nozzle(s) suctions the placement member such that the head unit holds the placement member has been shown in each of the aforementioned first and second embodiments, and the example in which the gripper(s) grasps the placement member such that the head unit holds the placement member has been shown in the aforementioned second embodiment, the present disclosure is not restricted to this. For example, an engaging tool(s) that engages with the placement member by a method other than grapping may be attached to the tip(s) of the head(s) of the head unit, and the engaging tool(s) may engage with the placement member such that the head unit holds the placement member.

While the example in which when the placement member is held by a plurality of heads, the placement member is held by a pair of heads has been shown in each of the aforementioned first and second embodiments, the present disclosure is not restricted to this. For example, when the placement member is held by a plurality of heads, the placement member may be held by a plurality of heads (three heads, for example) other than a pair of heads. Alternatively, when the placement member is held by a plurality of heads, the placement member may be held by a plurality of pairs of heads.

While the example in which when holding the placement member, a plurality (pair) of heads are synchronously lowered toward the placement member has been shown in each of the aforementioned first and second embodiments, the present disclosure is not restricted to this. According to the present disclosure, as long as the plurality of heads are synchronously raised or lowered after holding the placement member, the plurality of heads may not be synchronously lowered before holding the placement member.

While the example in which the component imagers are used as imagers that image the placement member held by the head unit has been shown in each of the aforementioned first and second embodiments, the present disclosure is not restricted to this. For example, dedicated imagers may be used as the imagers that image the placement member held by the head unit.

While the example in which the suction nozzles for component mounting are used as suction nozzles for transfer has been shown in the aforementioned first embodiment, the present disclosure is not restricted to this. For example, suction nozzles dedicated for transfer may be used as the suction nozzles for transfer.

While the example in which the placement member includes the pair of notches for grasping that face each other has been shown in the aforementioned second embodiment, the present disclosure is not restricted to this. For example, the placement member may include a pair of openings for grasping that face each other. Alternatively, the placement member may not include the pair of notches or openings that face each other.

Figure 14:
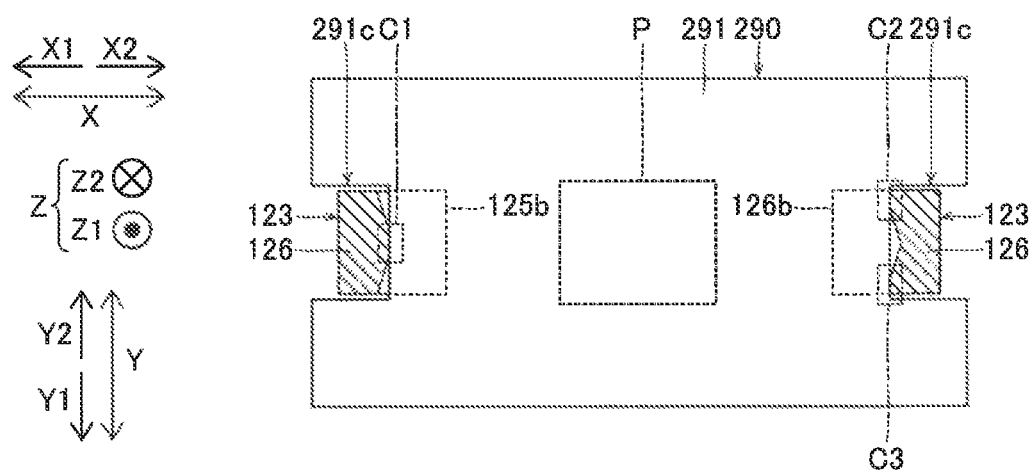
FIG. 14 is a plan view illustrating a first placement portion of a placement member according to a modified example of the second embodiment.

While the example in which each of the pair of notches of the placement member includes the guide having a shape that gradually tapers toward the grasping position has been shown in the aforementioned second embodiment, the present disclosure is not restricted to this. For example, as in a modified example shown in FIG. 14, a first placement portion 291 of a placement member 290 may have a pair of rectangular notches 291*c*.

What is claimed is:

1. A component mounting device comprising:
a conveyance unit configured to convey a placement member on which a mounting target is placed;
a head unit, movable in a horizontal plane, and including a head configured to hold a component and mount the held component on the mounting target; and
a controller configured to control operation of the head unit, such that the controller controls transfer of the mounting target from the conveyance unit to a transfer position located at a position different from that of the conveyance unit by controlling at least movement of the head unit in the horizontal plane in a state in which the placement member is held by one or a plurality of heads of the head unit.

2. The component mounting device according to claim 1, wherein the controller is configured to control lowering of the plurality of heads toward the placement member, and synchronous raising of the plurality of heads that hold the placement member after controlling the plurality of heads to hold the placement member.

3. The component mounting device according to claim 2, wherein the controller is configured to control one or more pairs of the heads to hold the placement member in such a manner as to sandwich the mounting target when the plurality of heads hold the placement member.

4. The component mounting device according to claim 2, further comprising a suction nozzle attached to a tip of the one or the plurality of heads and configured to suction the placement member such that the head unit holds the placement member.

5. The component mounting device according to claim 2, further comprising a gripper attached to a tip of the one or the plurality of heads and configured to grasp a pair of facing portions of the placement member such that the head unit holds the placement member.

6. The component mounting device according to claim 2, wherein the controller is configured to determine the head that holds the placement member among the plurality of heads based on information about a size of the placement member, information about a size of the mounting target placed on the placement member, and information about a distance between a pair of the heads.

7. The component mounting device according to claim 2, wherein the controller is configured to control of announcing a size of the placement member on which the mounting target is placed based on information about a size of the mounting target and information about a distance between a pair of the heads that hold the placement member.

8. The component mounting device according to claim 2, further comprising an imager configured to image the placement member held by the head of the head unit when the mounting target is transferred by the head unit; wherein
the controller is configured to acquire a state of the placement member held by the head of the head unit based on a result of imaging of the placement member by the imager.

9. The component mounting device according to claim 2, wherein
the mounting target has a three-dimensional shape as compared with a flat plate shape;
the component mounting device further comprises a mounting target holder configured to hold the mounting target via the placement member and move the held mounting target along an upward-downward direction, or rotate or incline the held mounting target when the head unit performs mounting on the mounting target; and
the controller is configured to control the transfer of the mounting target from the conveyance unit toward the mounting target holder by controlling the movement of the head unit in the horizontal plane in the state in which the placement member is held by the one or the plurality of heads of the head unit.

10. The component mounting device according to claim 1, wherein the controller is configured to control one or more pairs of the heads to hold the placement member in such a manner as to sandwich the mounting target when the plurality of heads hold the placement member.

11. The component mounting device according to claim 1, further comprising a suction nozzle attached to a tip of the one or the plurality of heads and configured to suction the placement member such that the head unit holds the placement member.

12. The component mounting device according to claim 1, further comprising a gripper attached to a tip of the one or the plurality of heads and configured to grasp a pair of facing portions of the placement member such that the head unit holds the placement member.

13. The component mounting device according to claim 12, wherein
the placement member includes a pair of notches or openings that face each other; and
the head unit is configured to grasp the pair of notches or openings of the placement member by the gripper, or is configured to grasp the pair of notches or openings of the placement member by a pair of grippers.

14. The component mounting device according to claim 13, wherein the pair of notches or openings of the placement member each include a guide having a shape that gradually tapers toward a grasping position of the gripper in the placement member to guide the gripper to the grasping position.

15. The component mounting device according to claim 13, wherein
the gripper includes a first gripper configured to hold the placement member at one point, and a second gripper configured to hold the placement member at two points; and
the first gripper is configured to hold one side of the placement member at the one point, and the second gripper is configured to hold another side of the placement member at the two points such that the head unit grasps the placement member in a three-point support manner.

16. The component mounting device according to claim 12, wherein
the gripper includes a first gripper configured to hold the placement member at one point, and a second gripper configured to hold the placement member at two points; and
the first gripper is configured to hold one side of the placement member at the one point, and the second gripper is configured to hold another side of the placement member at the two points such that the head unit grasps the placement member in a three-point support manner.

17. The component mounting device according to claim 1, wherein the controller is configured to determine the head that holds the placement member among the plurality of heads based on information about a size of the placement member, information about a size of the mounting target placed on the placement member, and information about a distance between a pair of the heads.

18. The component mounting device according to claim 1, wherein the controller is configured to control of announcing a size of the placement member on which the mounting target is placed based on information about a size of the mounting target and information about a distance between a pair of the heads that hold the placement member.

19. The component mounting device according to claim 1, further comprising an imager configured to image the placement member held by the head of the head unit when the mounting target is transferred by the head unit; wherein
the controller is configured to acquire a state of the placement member held by the head of the head unit based on a result of imaging of the placement member by the imager.

20. The component mounting device according to claim 1, wherein
the mounting target has a three-dimensional shape as compared with a flat plate shape;
the component mounting device further comprises a mounting target holder configured to hold the mounting target via the placement member and move the held mounting target along an upward-downward direction, or rotate or incline the held mounting target when the head unit performs mounting on the mounting target; and
the controller is configured to control the transfer of the mounting target from the conveyance unit toward the mounting target holder by controlling the movement of the head unit in the horizontal plane in the state in which the placement member is held by the one or the plurality of heads of the head unit.

* * * * *